(12) United States Patent  
Lin et al.

(10) Patent No.: US 9,331,239 B1
(45) Date of Patent: May 3, 2016

(54) LIGHT-EMITTING DEVICE

(71) Applicant: EPISTAR CORPORATION, Hsinchu (TW)

(72) Inventors: Yi-Chieh Lin, Hsinchu (TW); Cheng-Long Yeh, Hsinchu (TW); Rong-Ren Lee, Hsinchu (TW); Shih-Chang Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/793,389

(22) Filed: Jul. 7, 2015

(51) Int. Cl.
*H01L 29/06* (2006.01)
*H01L 27/15* (2006.01)
*H01L 31/0328* (2006.01)
*H01L 21/00* (2006.01)
*H01L 33/06* (2010.01)
*H01L 33/14* (2010.01)
*H01L 33/00* (2010.01)
*H01L 33/30* (2010.01)

(52) U.S. Cl.
CPC ............ *H01L 33/06* (2013.01); *H01L 33/0025* (2013.01); *H01L 33/14* (2013.01); *H01L 33/30* (2013.01)

(58) Field of Classification Search
CPC .................. H01L 33/06; H01L 33/007; H01L 2924/12041; H01L 29/2003; H01L 33/0075; H01L 21/02389; H01L 25/167; H01L 33/0025; H01L 29/66462; H01L 51/5012
USPC ............ 257/13–15, 85, 90, 284, 189; 438/22, 438/29, 37, 46, 47, 48, 87
See application file for complete search history.

(56) References Cited

U.S. PATENT DOCUMENTS

| | | | |
|---|---|---|---|
| 2011/0286487 A1* | 11/2011 | Sato .................. | B82Y 20/00 372/45.011 |
| 2011/0298006 A1* | 12/2011 | Hagino ............... | B82Y 20/00 257/103 |
| 2015/0063392 A1* | 3/2015 | Takayama ........... | H01S 5/2205 372/45.01 |
| 2015/0146756 A1* | 5/2015 | Kawaguchi .......... | H01L 33/04 372/45.012 |

* cited by examiner

*Primary Examiner* — Hsien Ming Lee
(74) *Attorney, Agent, or Firm* — Ditthavong & Steiner, P.C.

(57) ABSTRACT

A light-emitting device is provided. The light-emitting device comprises a light-emitting stack comprising a first cladding layer of n type, a second cladding layer of p type, and an active layer between the first cladding layer and the second cladding layer wherein the active layer comprises a well layer interposed between adjacent barrier layers. The light-emitting device further comprises a means for reducing a flicker noise of the light-emitting device.

20 Claims, 3 Drawing Sheets

US 9,331,239 B1

LIGHT-EMITTING DEVICE

TECHNICAL FIELD

The disclosure relates to a light-emitting device, and more particularly to a light-emitting device with a lower flicker noise.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical device.

SUMMARY OF THE DISCLOSURE

The present disclosure provides a light-emitting device. The light-emitting device comprises a light-emitting stack comprising a first cladding layer of n type, a second cladding layer of p type, and an active layer between the first cladding layer and the second cladding layer, wherein the active layer comprises a well layer interposed between adjacent barrier layers. The light-emitting device further comprises a means for reducing a flicker noise of the light-emitting device.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
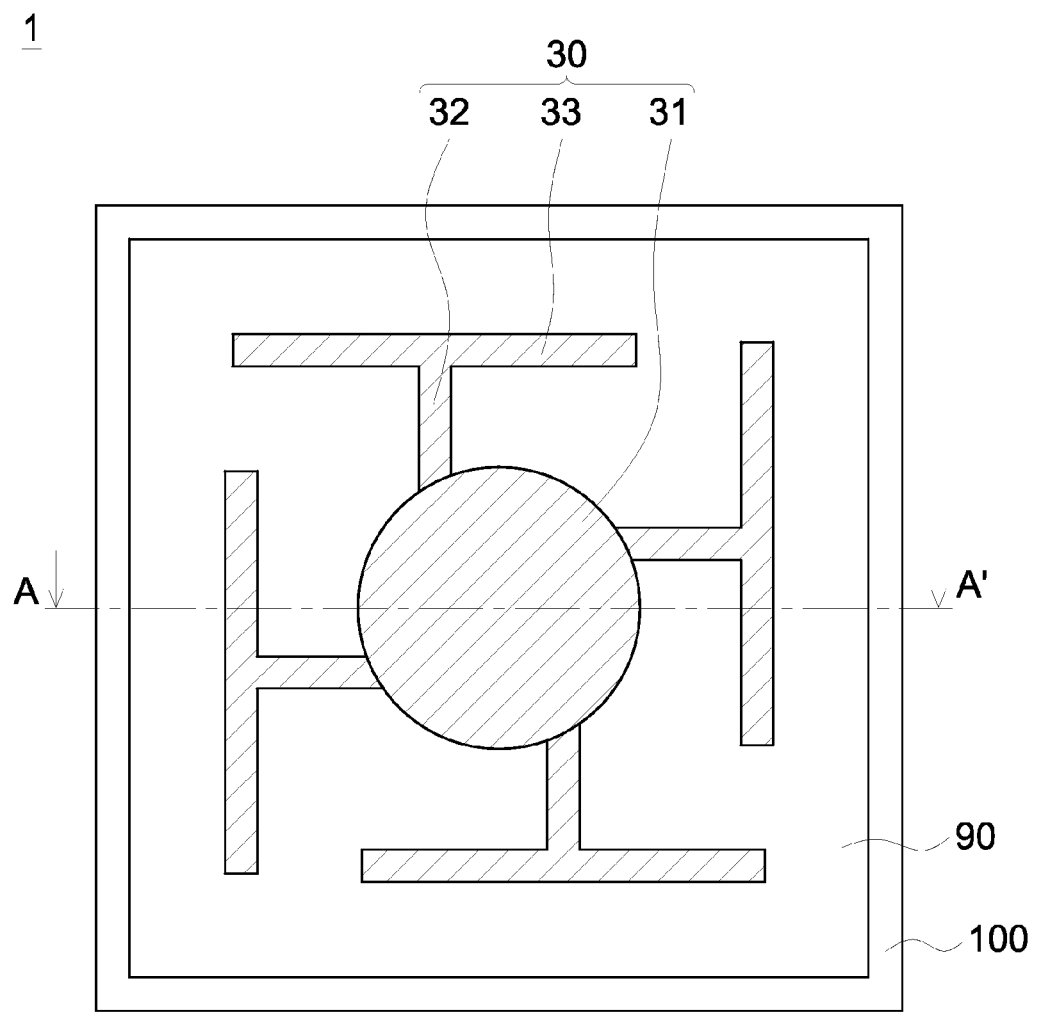
FIG. 1 is a top view of the light-emitting device in accordance with the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

In the present application, if not specifically mention, the general expression of AlGaAs means $Al_xGa_{(1-x)}As$, wherein $0 \leq x \leq 1$; the general expression of AlInP means $Al_xIn_{(1-x)}P$, wherein $0 \leq x \leq 1$; the general expression of AlGaInP means $(Al_yGa_{(1-y)})_{1-x}In_xP$, wherein $0 \leq x \leq 1$, $0 \leq y \leq 1$; and the general expression of InGaP means $In_xGa_{1-x}P$, wherein $0 \leq x \leq 1$. The content of the element can be adjusted for different purposes, such as matching the lattice constant of the growth substrate or adjusting the dominant wavelength.

Figure 2:
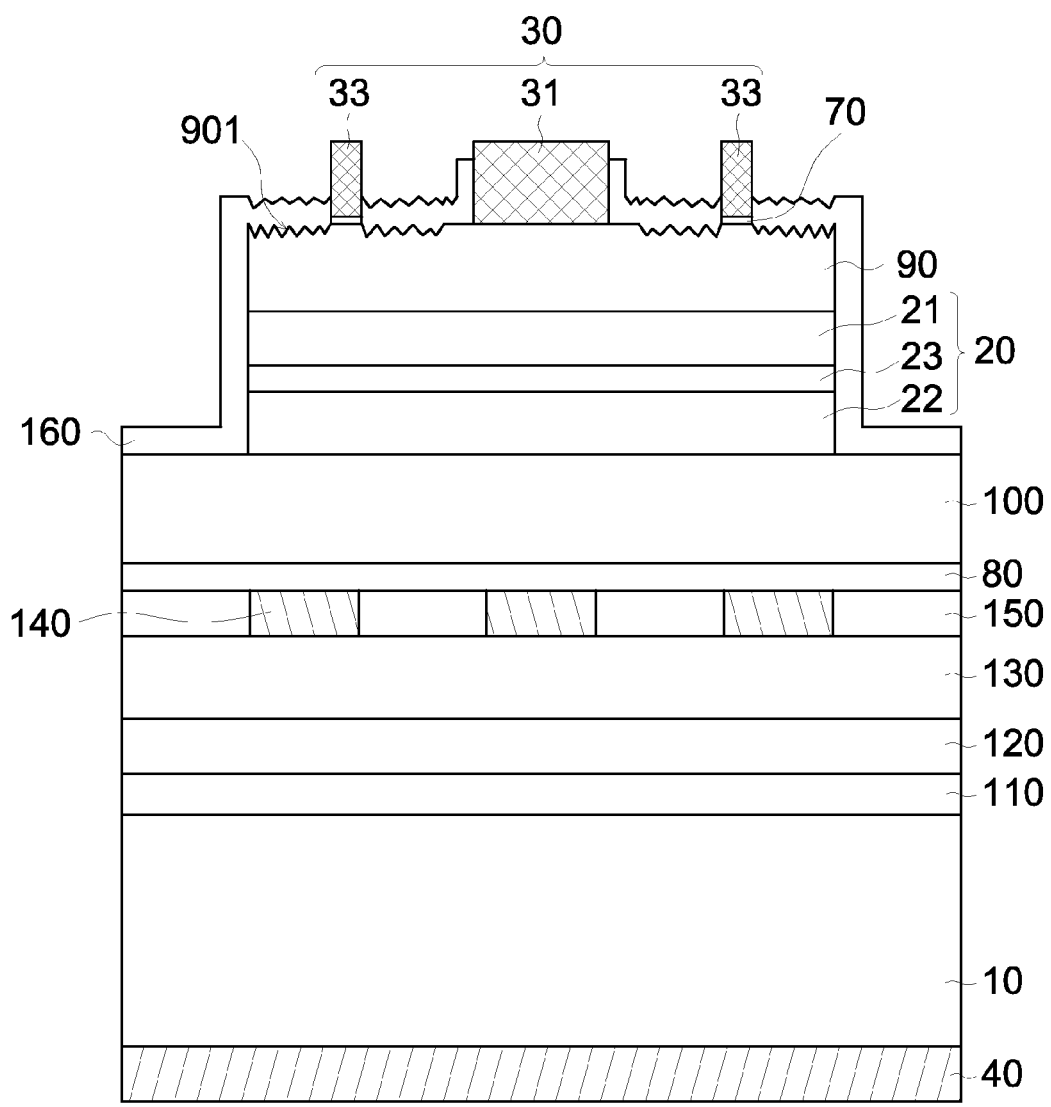
FIG. 2 is a cross-sectional diagram along an A-A' line in FIG. 1.

FIG. 1 is a top view of a light-emitting device in accordance with a present application; FIG. 2 is a cross-sectional diagram along an A-A' line of the light-emitting device 1 in FIG. 1. The light-emitting device 1 comprises a substrate 10, a light-emitting stack 20 on a side of the substrate 10, a first electrode 30 on the light-emitting stack 20 and a second electrode 40 on another side of the substrate 10 opposite to the light-emitting stack 20. The light-emitting stack 20 comprises a first cladding layer 21 of n type, a second cladding layer 22 of p type, and an active layer 23 between the first cladding layer 21 and the second cladding layer 22. The band gap of the first cladding layer 21 and the band gap of the second cladding layer 22 are both higher than the band gap of the active layer 23. The light-emitting device 1 has a flicker noise that is an intrinsic noise in an electronic device and is well known to one with ordinary skill in the art.

REFERENCE EMBODIMENT

In a reference embodiment, the first cladding layer 21 has an n-type ☐carrier concentration greater than $9 \times 10^{17}/cm^3$. The n-type carrier concentration is calculated by the number of activated n-type dopants excluding inactivated n-type dopants, wherein an activated dopant is a dopant replacing an atom in a base material or inserted in to a base material so as to produce free electrons as carriers. On the contrary, inactivated n-type dopants substantially do not contribute to the n-type carrier 20 concentration. The carrier concentration can be determined by Electrochemical Capacitance Voltage (ECV). The first cladding layer 21 comprises a Group III-V semiconductor material, such as AlGaAs, AlInP or AlGaInP. The n-type dopant can be Si or Te. The second cladding layer 22 comprises p-type carrier concentration not less than $1 \times 10^{17}/cm^3$, and preferably between $5 \times 10^{17}/cm^3$ and $5 \times 10^{18}/cm^3$. Herein, the p-type carrier concentration is the number of activated p-type dopants of excluding inactivated p-type dopants, wherein an activated p-type dopant is a dopant replacing an atom in a base material so as to produce free holes as carriers. On the contrary, inactivated p-type dopants substantially do not contribute to the p-type carrier concentration. The second cladding layer 22 comprises a Group III-V semiconductor material, such as AlGaAs, AlInP or AlGaInP. The p-type dopant can be C, Zn or Mg. In the present embodiment, the first cladding layer 21 and the second cladding layer 22 both comprise AlGaAs, the n-type dopant is Te, and the p-type dopant is C.

The active layer 23 emits a radiation having a dominant wavelength. Preferably, the radiation is invisible or infrared. More preferably, the dominant wavelength is between 790 nm and 1500 nm both inclusive. In the present embodiment, the structure of the active layer 23 comprises Multiple Quantum Well (MQW). The material of the active layer 23 comprises a Group III-V semiconductor material, for example, referring to FIG. 3, the active layer 23 comprises alternate well layers 231 of $In_xGa_{1-x}As$ and barrier layers 232 of $Al_yGa_{1-y}As_{1-z}P_z$, wherein $0 \leq x \leq 1$, $0 \leq y \leq 1$, $0 \leq z \leq 1$. The number of the well layers 231 or the barrier layers 232 is larger than 2, and preferably, less than 10. Each of the well layers 231 has a thickness not less than 9 nm, and preferably not greater than 18 nm. In the present embodiment, the dominant wavelength is between 925 nm and 955 nm by having the well layers 231 being $In_xGa_{1-x}As$, wherein $0.15 \leq x \leq 0.22$. The barrier layers 232 comprise $Al_yGa_{1-y}As_{1-z}P_z$, wherein $0.19 \leq y \leq 0.3$ and $0.1 \leq z \leq 0.3$.

First Embodiment

A light-emitting device of the first embodiment is provided. The □difference between the light-emitting device of the first embodiment and the reference embodiment is that the light-emitting device of the present embodiment comprises a means for reducing the flicker noise (1/f) by having the n-type carrier concentration of the first cladding layer to be less than $9 \times 10^{17}/cm^3$, for example, $1.2 \times 10^{18}/cm^3$, and preferably between $3 \times 10^{17}/cm^3$ and $7 \times 10^{17}/cm^3$, and more preferably between $4.5 \times 10^{17}/cm^3$ and $5.5 \times 10^{17}/cm^3$. The n-type carrier concentration is less than $9 \times 10^{17}/cm^3$ such that the first cladding layer 21 can provide adequate activated n-type dopants instead of excessive amount of activated n-type dopants, and thus light-emitting device 1 achieves a low flicker noise and desirable light extraction efficiency at the same time. The light-emitting device 1 of the present embodiment has a lower flicker noise by having the means for reducing a flicker noise (1/f) of the light-emitting device 1, wherein the means comprises an n-type carrier concentration of the first cladding layer 21 less than $9 \times 10^{17}/cm^3$. Furthermore, although the n-type carrier concentration of the present embodiment is less than the n-type carrier concentration of the light-emitting device of the reference embodiment, the light extraction efficiency of the present embodiment is even improved by more than 10% compared to the light extraction efficiency of the reference embodiment. That is to say, since the light-emitting device 1 comprises the means for reducing the flicker noise, the light-emitting device 1 has a lower flicker noise and improved light extraction efficiency both. The method of measuring the flicker noise can be any method well known to one with ordinary skill in the art.

Second Embodiment

A light-emitting device in accordance with the second embodiment of the present disclosure comprises substantially the same structure as the reference embodiment, and the difference is that the light-emitting device of the present embodiment comprises a means for reducing the flicker noise (1/f) of the light-emitting device by having the well layers 231 to be $In_xGa_{1-x}As$, wherein $0.06 \leq x \leq 0.14$, and preferably, $0.10 \leq x \leq 0.12$. That is to say, the indium content in the well layers 231 of the second embodiment is lower than that of the light-emitting device of the reference embodiment as mentioned above for reducing the flicker noise (1/f). In the present embodiment, compared to the light-emitting device of the reference embodiment, the light-emitting device 1 of the present embodiment has a lower flicker noise because the light-emitting device 1 of the present embodiment comprises the means for reducing a flicker noise (1/f) of the light-emitting device, which is the active layer 23 comprising the well layers 231 of $In_xGa_{1-x}As$ with x between 0.06 and 0.14 both inclusive, wherein the indium content is lower than that of the light-emitting device of the first embodiment. Furthermore, the light extraction efficiency of the present embodiment is improved by more than 10% compared to the light-emitting device of the reference embodiment. The method of measuring the flicker noise can be any method well known to one with ordinary skill in the art.

Third Embodiment

A light-emitting device 1 in accordance with the third embodiment of the present disclosure comprises substantially the same structure as the reference embodiment, and the difference is that the barrier layers 232 comprise $Al_yGa_{1-y}As_{1-z}P_z$, wherein $0.14 \leq y \leq 0.18$. Specifically, the means for reducing the flicker noise (1/f) of the light-emitting device 1 comprises the barrier layers 232 of $Al_yGa_{1-y}As_{1-z}P_z$, wherein $0.14 \leq y \leq 0.18$. That is to say, the aluminum content in the barrier layers 232 of the present embodiment is lower than that of the light-emitting device of the reference embodiment as mentioned above. In the present embodiment, compared to the light-emitting device of the reference embodiment, the light-emitting device 1 of the present embodiment has a lower flicker noise under the same measurement conditions because of comprising the means for reducing the flicker noise (1/f) of the light-emitting device 1, wherein the means comprises the active layer 23 comprising the barrier layers 232 of $Al_yGa_{1-y}As_{1-z}P_z$ with y between 0.14 and 0.18 both inclusive. Furthermore, the light extraction efficiency of the present embodiment is improved by more than 9% compared to the light-emitting device of the reference embodiment. The method of measuring the flicker noise can be any method well known to one with ordinary skill in the art.

Fourth Embodiment

A light-emitting device 1 in accordance with the fourth embodiment of the present disclosure comprises substantially the same structure as the reference embodiment, and the difference is that the well layers 231 each has a thickness less than 9 nm, and preferably, between 5 nm and 8 nm. Specifically, the means for reducing the flicker noise (1/f) of the light-emitting device 1 comprises that the active layer 23 comprising the well layers 231 each having a thickness less than 9 nm. That is to say, the thickness of each well layer of the present embodiment is smaller than that of the light-emitting device of the reference embodiment as mentioned above. In the present embodiment, compared to the light-emitting device of the reference embodiment, the light-emitting device 1 of the present embodiment has a lower flicker noise under the same measurement conditions because the means for reducing the flicker noise (1/f) of the light-emitting device, wherein the means comprise the active layer 23 comprising the well layers 231 each having a thickness less than 9 nm. Furthermore, the light extraction efficiency of the present embodiment is improved by more than 5% compared to the light-emitting device of the reference embodiment. The method of measuring the flicker noise can be any method well known to one with ordinary skill in the art.

Fifth Embodiment

A light-emitting device 1 in accordance with the fifth embodiment of the present disclosure comprises substantially the same structure as the reference embodiment, and the difference is that the light-emitting device 1 comprises multiple means for reducing a flicker noise (1/f) of the light-emitting device 1. Specifically, a first means for reducing a flicker noise (1/f) of the light-emitting device 1 of the present embodiment is the same as the first embodiment, that is, the first cladding layer 21 has an n-type carrier concentration less than $9 \times 10^{17}/cm^3$, and preferably between $3 \times 10^{17}/cm^3$ and $6 \times 10^{17}/cm^3$. Besides, in the present embodiment, the light-emitting device 1 further comprises a second means, a third means and a fourth means for reducing a flicker noise (1/f) of the light-emitting device 1 as mentioned in the second, third and fourth embodiment respectively. That is to say, the second means comprises the active layer 23 comprising the well layers 231 of $In_xGa_{1-x}As$, wherein $0.06 \leq x$ 0.14, and preferably, $0.10 \leq x \leq 0.12$. The third means comprises the well layers 231 each having a thickness less than 9 nm, and preferably, between 5 nm and 8 nm. The fourth means comprises the barrier layers 232 being $Al_yGa_{1-y}As_{1-z}P_z$, wherein $0.14 \leq y \leq 0.18$. Compared to the light-emitting device of the reference embodiment as mentioned above, the light-emitting device 1 of the present embodiment has a lower flicker noise under the same measurement conditions because the light-emitting device 1 comprises multiple means for reducing a flicker noise (1/f) of the light-emitting device 1. Furthermore, the light extraction efficiency of the present embodiment is improved by more than 10% compared to the light-emitting device of the reference embodiment. The method of measuring the flicker noise can be any method well known to one with ordinary skill in the art.

Figure 4:
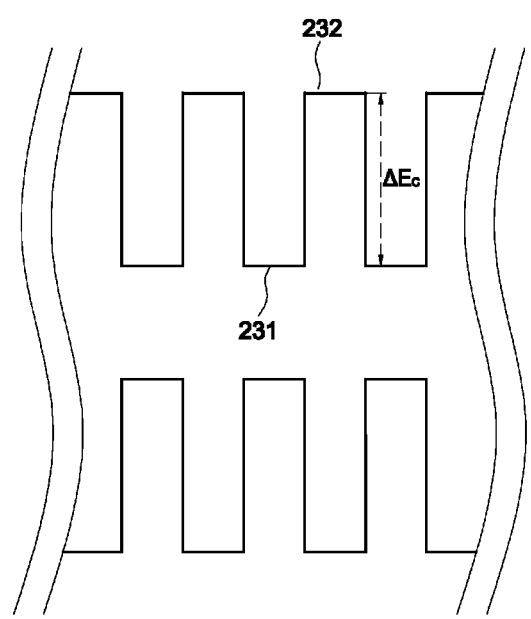
FIG. 4 is a diagram showing an energy difference ($\Delta Ec$) between a conduction band of the well and a conduction band of one of the adjacent barrier layers of the active layer of the present application.

The differences between the embodiments of the present disclosure as mentioned above and the light-emitting device of the reference embodiment and the result of the flicker noises of the embodiments and the light-emitting device of the reference embodiment are shown in Table 1.

between 0.15 and 0.25 eV, wherein the energy difference ($\Delta$Ec) is the difference between an energy level of the conduction band of the well and an energy level of a conduction band of one of the adjacent barrier layers 232, as shown in FIG. 4. Specifically, the means for reducing the flicker noise (1/f) of the light-emitting device 1 comprises the energy difference ($\Delta$Ec) of the active layer 23 being between 0.1 and 0.3 eV. Preferably, the energy difference ($\Delta$Ec) is between 0.15 and 0.25 eV. The energy difference can be adjusted by changing the element contents in the barrier layers 232 and in the well layers 231 and/or by changing the thickness of the well layers 231. Compared to the light-emitting device of the reference embodiment as mentioned above, the light-emitting device 1 of the present embodiment has a lower flicker noise under the same measurement conditions because the light-emitting device 1 having the means for reducing the flicker noise (1/f).

In one embodiment, the light-emitting device 1 comprises two or more than two means for reducing a flicker noise selected from those described in the first to fourth and sixth embodiments.

TABLE 1

| | n-type carrier concentration | Composition of the well layers ($In_xGa_{1-x}As$) | Composition of the barrier layers ($Al_yGa_{1-y}As_{1-z}P_z$,) | Thickness of the well layers (nm) | Ranking of flicker noise |
|---|---|---|---|---|---|
| 1st embodiment | $<9 \times 10^{17}/cm^3$ | $0.15 \leq x \leq 0.22$ | $0.19 \leq y \leq 0.3$ | >9 nm | 5 |
| 2nd embodiment | $>9 \times 10^{17}/cm^3$ | $0.06 \leq x \leq 0.14$ | $0.19 \leq y \leq 0.3$ | >9 nm | 4 |
| 3rd embodiment | $>9 \times 10^{17}/cm^3$ | $0.15 \leq x \leq 0.22$ | $0.14 \leq y \leq 0.18$ | >9 nm | 3 |
| 4th embodiment | $>9 \times 10^{17}/cm^3$ | $0.15 \leq x \leq 0.22$ | $0.19 \leq y \leq 0.3$ | <9 nm | 2 |
| 5th embodiment | $<9 \times 10^{17}/cm^3$ | $0.06 \leq x \leq 0.14$ | $0.14 \leq y \leq 0.18$ | <9 nm | 6 (lowest flicker noise) |
| Reference embodiment | $>9 \times 10^{17}/cm^3$ | $0.15 \leq x \leq 0.22$ | $0.19 \leq y \leq 0.3$ | >9 nm | 1 (highest flicker noise) |

From Table. 1, it is clear that the flicker noise of the light-emitting device of the reference embodiment is the highest. The flicker noise of the 4th embodiment, which comprises the means comprising the well layers 231 each having a thickness less than 9 nm, is lower than the flicker noise of the reference embodiment. The flicker noise of the third embodiment, which comprises the means comprising the barrier layers 232 of $Al_yGa_{1-y}As_{1-z}P_z$, wherein $0.14 \leq y \leq 0.18$, is lower than that of the 4th embodiment. The flicker noise of the second embodiment, which comprises the means comprising the well layers 231 comprising $In_xGa_{1-x}As$, wherein $0.06 \leq x \leq 0.14$, is lower than that of the third embodiment. The flicker noise of the first embodiment, which comprises the means comprising the n-type carrier concentration less than $9 \times 10^{17}/cm^3$, is lower than that of the second embodiment. The flicker noise of the fifth embodiment, which comprises multiple means, is the lowest. Accordingly, among the multiple means for reducing a flicker noise (1/f) of the light-emitting device 1, the means comprising the n-type carrier concentration less than $9 \times 10^{17}/cm^3$ is the most efficient means for reducing a flicker noise (1/f) of the light-emitting device 1 compared to the other means.

In one embodiment, the light-emitting device 1 in accordance with the sixth embodiment of the present disclosure comprises substantially the same structure as the second embodiment, and the difference is that the x content of $In_xGa_{1-x}As$ of the active layer 23 is not limited to between 0.06 and 0.14, and the active layer 23 comprises an energy difference ($\Delta$Ec) between 0.1 and 0.3 eV, and preferably In one embodiment, the first cladding layer 21 has a thickness less than 1 um, and preferably greater than 100 nm, and more preferably, between 150 nm and 650 nm, and more preferably, between 250 nm and 450 nm. If the thickness of the first cladding layer 21 is less than 100 nm, the first cladding layer 21 may not be able to block overflow carriers efficiently. If the thickness of the first cladding layer 21 is greater than 1 um, the first cladding layer 21 is too thick and may block the light emitted from the active layer 23, and thus the light extraction efficiency of the light-emitting device 1 is low.

In one embodiment, the second cladding layer 22 has a thickness not less than 50 nm, and preferably, between 300 nm and 500 nm. More preferably, the thickness of the first cladding layer 21 is smaller than the thickness of the second cladding layer 22.

In one embodiment, each of the barrier layers 232 has a thickness not less than 15 nm, and preferably not greater than 45 nm.

In one embodiment, the number of the well layers 231 is between 3 and 5, and the number of the barrier layers 232 is between 2 and 4. The well layers 231 and the barrier layers 232 are all undoped.

Figure 3:
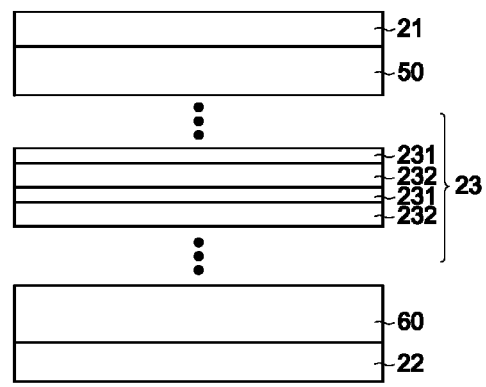
FIG. 3 is a cross-sectional diagram of the active layer of the light-emitting device of the present application.

Referring to FIG. 3, in one embodiment, the light-emitting stack 20 further comprises a first confinement layer 50 between the first cladding layer 21 and the active layer 23. The first confinement layer 50 has a band gap between the band gap of one of the well layers 231 and the band gap of the first cladding layer 21. Preferably, the first confinement layer 50 has a band gap lower than the band gap of one of the barriers. The first confinement layer 50 comprises a Group III-V semiconductor material, such as AlGaAs, AlInP or AlGaInP. In the present embodiment, the first confinement layer 50 comprises AlGaAs. The first confinement layer 50 is preferably undoped. The first confinement layer 50 has a thickness greater than the thickness of one of the barrier layers 232, and preferably greater than the thickness of the first cladding layer 21 for blocking excessive amount of carriers from overflowing into the active layer 23. The thickness of the first confinement layer 50 is not less than 200 nm, and preferably, not greater than 1000 nm. A difference between the thickness of the first confinement layer 50 and the thickness of the first cladding layer 21 is not less than 100 nm, and preferably, not greater than 400 nm. Because the first confinement layer 50 has a thickness greater than the thickness of the first cladding layer 21, and because the difference of the thickness of the first confinement layer 50 and the thickness of the first cladding layer 21 is between 100 nm and 400 nm, the first cladding layer 21 can provide adequate activated n-type dopants, and the first confinement layer 50 can efficiently block excessive amount of activated n-type dopants from overflowing into the active layer 23 while still allow enough activated n-type dopants flowing into the active layer 23. Therefore, the light-emitting device 1 has a low flicker noise and desirable light extraction efficiency at the same time. In the present embodiment, the thickness of the first confinement layer 50 is between 500 and 600 nm. In one embodiment, the light-emitting stack 20 further comprises a second confinement layer 60 between the second cladding layer 22 and the active layer 23. The second confinement layer 60 has a band gap between the band gap of one of the well layers 231 and the band gap of second cladding layer 22. Preferably, the second confinement layer 60 has a band gap lower than the band gap of one of the barriers. The second confinement layer 60 comprises a Group III-V semiconductor material, such as AlGaAs, AlInP or AlGaInP. In the present embodiment, the second confinement layer 60 comprises AlGaAs. The second confinement layer 60 is preferably undoped. The second confinement layer 60 has a thickness greater than the thickness of one of the barrier layers 232, and preferably greater than the thickness of the second cladding layer 22. The thickness of the second confinement layer 60 is not less than 100 nm, and preferably, not greater than 400 nm. In the present embodiment, the thickness of the second confinement layer 50 is between 500 and 600 nm. The first confinement layer 50 and the second confinement layer 60 can lower the forward voltage of the light-emitting device 1 and block excessive amount of carriers from flowing into the active layer 23.

Referring to FIG. 1, the first electrode 30 comprises a main part 31, a first extension 32 and a second extension 33. The first extension 32 extends from the main part 31 away from the main part 31. The second extension 33 is substantially perpendicular to the first extension 32. The material of the first electrode 30 and the second electrode 40 comprise transparent conductive material or metal material, wherein the transparent conductive material comprises transparent conductive oxide, and wherein the metal material includes Au, Pt, GeAuNi, Ti, BeAu, GeAu, Al, or ZnAu.

In one embodiment, the substrate 10 is electrically conductive for conducting a current flowing between the first electrode 30 and the third electrode. The substrate 10 has a thickness thick enough for supporting the layers or structures thereon, for example, greater than 100 μm, and preferably smaller than 200 μm. The substrate comprises a conductive material comprising Si, Cu, Al, Mo, Sn, Zn, Cd, Ni, Co, diamond like carbon (DLC), graphite, carbon fiber, metal matrix composite (MMC) or ceramic matrix composite (CMC). Preferably, the substrate 10 comprises Si.

Referring to FIG. 2, the light-emitting device 1 further comprises a first contact layer 70 between the first extension 32 and the light-emitting stack 20 and between the second extension 33 and the light-emitting stack 20 such that the first electrode 30 is electrically connected to the light-emitting stack 20 through the first contact layer 70 for forming an ohmic contact with the first electrode 30 and the light-emitting stack 20. In one embodiment, the light-emitting device 1 further comprises a second contact layer 80 between the substrate 10 and the light-emitting stack 20 such that the second electrode 40 is electrically connected to the light-emitting stack 20 through the second contact layer 80 for forming an ohmic contact with the second electrode 40 and the light-emitting stack 20. The conductivity type of the first contact layer 70 is different from the conductivity type of the second contact layer 80. The first contact layer 70 and the second contact layer 80 are with high carrier concentration, such as greater than $10^{18}/cm^3$, and preferably, between $5\times10^{18}/cm^3$ and $5\times10^{19}/cm^3$ both inclusive. The material of the first contact layer and the second contact layer comprise a Group III-V semiconductor material, such as GaAs, AlGaAs, InGaP, GaP or AlGaInP. In the present embodiment, the first contact layer 70 comprises n-type GaAs, and the second contact layer 80 comprises p-type GaP.

Referring to FIG. 2, in one embodiment, the light-emitting device 1 further comprises a first window layer 90 between the first electrode 30 and the light-emitting stack 20 for improving current spreading through the light-emitting stack 20. The first window layer 90 comprises a surface 901 opposite to the substrate 10 and facing the first electrode 30. In one of the embodiment, a part of the surface 901 that is not covered by the first electrode 30, is roughened. Preferably, the roughness is between 0.1 um and 3 μm, and preferably between 0.3 μm and 2 μm. The thickness of the first window layer 90 is not less than 3000 nm, and preferably, not greater than 11000 nm. In one embodiment, the light-emitting device 1 further comprises a second window layer 100 between the second electrode 40 and the light-emitting stack 20 for improving current spreading. The thickness of the second window layer 100 is not less than 100 nm, and preferably, not greater than 5000 nm. The first window layer 90 and the second window layer 100 comprise a Group semiconductor material, such as AlGaAs or AlGaInP. Referring to FIG. 2, in one embodiment, the light-emitting device 1 further comprises a conductive connecting structure 110 between the substrate 10 and the light-emitting stack 20 for mechanically connecting the substrate 10 and the light-emitting stack 20. The conductive connecting structure 110 comprises transparent conducive material or metal material. The transparent conducive oxide material comprises indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), or indium zinc oxide (IZO). The metal material comprises In, Sn, Au, Ti, Ni, Pt, W or the combinations thereof.

Referring to FIG. 2, in one embodiment, the light-emitting device 1 further comprises a reflector 120 between the conductive connecting structure 110 and the light-emitting stack 20 for reflecting the radiation emitted from the active layer 23 toward the front side of the light-emitting device 1, wherein the front side of the light-emitting device 1 is the side where the first electrode 30 situates and is opposite to the rear side where the second electrode 40 situates. The reflector 120 is conductive for facilitating carriers flowing from the second electrode 40. The reflector 120 comprises a material with a reflectivity greater than 80% relative to the dominant wavelength of the light emitted from the active layer 23. Preferably, the reflector 120 comprises metal, such as Sn, Au, Ag, Al or the combinations thereof. The reflector 120 has a thickness of between about 2500 Å and 15000 Å.

Referring to FIG. 2, in one embodiment, the light-emitting device 1 further comprises a current spreading layer 130 between the reflector 120 and the second contact layer 80 for improving current spreading along the lateral direction. The material of the current spreading layer 130 comprises transparent conductive oxide comprising indium tin oxide (ITO), aluminum zinc oxide (AZO), SnCdO, antimony tin oxide (ATO), ZnO, $Zn_2SnO_4$ (ZTO) or indium zinc oxide (IZO), In the present embodiment, the current spreading layer 130 comprises IZO.

Referring to FIG. 2, in one embodiment, the light-emitting device 1 further comprises a transparent conductive layer 140 between the current spreading layer 130 and the second contact layer 80, and preferably, the transparent conductive layer 140 directly contacts the second contact layer 80 for reducing the series resistance between the second electrode 40 and the light-emitting stack 20. The material of transparent conductive layer 140 comprises transparent conductive oxide comprising indium tin oxide (ITO), aluminum zinc oxide (AZO), SnCdO, antimony tin oxide (ATO), ZnO, $Zn_2SnO_4$ (ZTO) or indium zinc oxide (IZO), In the present embodiment, the transparent conductive layer 140 comprise ITO.

Referring to FIG. 2, in one embodiment, the light-emitting device 1 further comprises an insulation layer 150 between the current spreading layer 130 and the second contact layer 80. The pattern of the insulation layer 150 is complementary to the pattern of the transparent conductive layer 140. The insulation layer 150 has a refractive index less than 1.5, and preferably between 1.3 and 1.45. The difference of the refractive index between the second contact layer 80 and the refractive index of the insulation layer 150 is larger than 1.5. The second contact layer 80, the insulation layer 150 and the reflector 120 form an omnidirectional reflector (ODR) for reflecting the light emitted from the active layer 23. The reflectivity of the omnidirectional reflector (ODR) is larger than 90%, and preferably is larger than 97%. The insulation layer 150 comprises porous $SiO_x$ or $MgF_x$.

Referring to FIG. 2, the light-emitting device 1 further comprises a passivation layer 160 covering the exposed surface 901 of the first window layer 90, a periphery wall of the light-emitting stack 20, and an exposed surface of the second window layer 100. The passivation layer 160 serves as a protection layer to protect the first window layer 90, the light-emitting stack 20 and the second window layer 100 from environment damage, such as moisture, or mechanical damage.

In one embodiment, the light-emitting device 1 can be used as a sensor for detecting a signal.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
a light-emitting stack comprising a first cladding layer of n type, a second cladding layer of p type, and an active layer between the first cladding layer and the second cladding layer, wherein the active layer comprises a well layer interposed between adjacent barrier layers; and
a means for reducing a flicker noise of the light-emitting device;
wherein the means comprises a carrier concentration of the first cladding layer being less than $9\times10^{17}/cm^3$ and greater than $1\times10^{17}/cm^3$.

2. The light-emitting device according to claim 1, wherein the carrier concentration is between $3\times10^{17}/cm^3$ and $7\times10^{17}/cm^3$.

3. The light-emitting device according to claim 1, further comprising a first confinement layer between the first cladding layer and the active layer, wherein the first confinement layer has a band gap between the band gap of the well layer and the band gap of the first cladding layer, and the first confinement layer has a thickness greater than a thickness of the first cladding layer.

4. The light-emitting device according to claim 3, wherein the thickness of the first confinement layer is between 200 and 1000 nm.

5. The light-emitting device according to claim 3, wherein a difference between the thickness of the first confinement layer and the thickness of the first cladding layer is between 100 nm and 400 nm.

6. The light-emitting device according to claim 1, wherein the means comprises the well layer comprising $In_xGa_{1-x}As$, wherein x is between 0.06 and 0.14.

7. The light-emitting device according to claim 6, wherein the means comprises the well layer having a thickness greater than 1 nm and less than 9 nm.

8. The light-emitting device according to claim 1, wherein the means comprises the barrier layers comprising $Al_xGa_{1-x}As_{1-y}P_y$, wherein x is between 0.14 and 0.18.

9. The light-emitting device according to claim 1, wherein the active layer emits a radiation having a dominant wavelength between 925 nm and 955 nm.

10. The light-emitting device according to claim 1, wherein the means comprises an energy difference between 0.1 and 0.3 eV, wherein the energy difference is between an energy level of the conduction band of the well layer and an energy level of the conduction band of one of the adjacent barrier layers.

11. A light-emitting device, comprising:
a light-emitting stack comprising a first cladding layer of n type, a second cladding layer of p type, an active layer between the first cladding layer and the second cladding layer, wherein the active layer comprises a well layer interposed between adjacent barrier layers;
a first means for reducing a flicker noise of the light-emitting device, wherein the first means is selected from the group consisting of (i) the first cladding layer having a carrier concentration between $3\times10^{17}/cm^3$ and $7\times10^{17}/cm^3$, (ii) the well layer having a thickness less than 9 nm and not less than 1 nm, (iii) the barrier layers comprising $Al_xGa_{1-x}As_{1-y}P_y$, wherein 0.14≤x≤0.18 and 0≤y≤1 [x is between 0.14 and 0.18], and (iv) the well layer comprising $In_zGa_{1-z}As$, wherein z is between 0.06 and 0.14; and
a second means selected from the group consisting of (i) the first cladding layer having a carrier concentration between $3\times10^{17}/cm^3$ and $7\times10^{17}/cm^3$, (ii) the well layer having a thickness less than 9 nm [9 nm] and not less than 1 nm [1 nm], (iii) the barrier layers comprising $Al_xGa_{1-x}As_{1-y}P_y$, wherein 0.14≤x≤0.18 and [x is between 0.14 and 0.18], and (iv) the well layer comprising $In_zGa_{1-z}As$, wherein z is between 0.06 and 0.14, wherein the first means and the second means are different.

12. The light-emitting device according to claim 11, further comprising a third means selected from the group consisting of (i) the first cladding layer having a carrier concentration between $3\times10^{17}/cm^3$ and $7\times10^{17}/cm^3$, (ii) the well layer having a thickness less than 9 nm [9 nm] and not less than 1 nm, (iii) the barrier layers comprising $Al_xGa_{1-x}As_{1-y}P_y$, wherein $0.14\leq x\leq 0.18$ and $0\leq y\leq 1$ [x is between 0.14 and 0.18], and (iv) the well layer comprising $In_zGa_{1-z}As$, wherein z is between 0.06 and 0.14, wherein the first means, the second means and the third means are different.

13. The light-emitting device according to claim 12, further comprising a fourth means selected from the group consisting of (i) the first cladding layer having a carrier concentration between $3\times10^{17}/cm^3$ and $7\times10^{17}/cm^3$, (ii) the well layer having a thickness less than 9 nm [9 nm] and not less than 1 nm, (iii) the barrier layers comprising $Al_xGa_{1-x}As_{1-y}P_y$, wherein $0.14\leq x\leq 0.18$ and $0\leq y\leq 1$ [x is between 0.14 and 0.18], and (iv) the well layer comprising $In_zGa_{1-z}As$, wherein z is between 0.06 and 0.14, wherein the first means, the second means, the third means and the fourth means are different.

14. The light-emitting device according to claim 11, wherein an energy difference between an energy level of the conduction band of the well layer and an energy level of the conduction band of one of the adjacent barrier layers is between 0.1 and 0.3 eV.

15. A light-emitting device for reducing flicker noise, comprising:
a light-emitting stack comprising a first cladding layer of n type, a second cladding layer of p type, an active layer between the first cladding layer and the second cladding layer and comprising barrier layers and a well layer interposed between adjacent barrier layers, wherein an energy difference between a conduction band of the well layer and a conduction band of one of the adjacent barrier layers is between 0.1 and 0.3 eV, and the first cladding layer has a thickness between 100 nm and 1000 nm.

16. The light-emitting device according to claim 15, wherein the first cladding layer has a carrier concentration between $3\times10^{17}/cm^3$ and $7\times10^{17}/cm^3$.

17. The light-emitting device according to claim 15, wherein the active layer emits a radiation comprising a dominant wavelength between 925 nm and 955 nm.

18. The light-emitting device according to claim 15, further comprising a first confinement layer between the first cladding layer and the active layer, wherein the first confinement layer has a thickness between 200 nm and 1000 nm.

19. The light-emitting device according to claim 18, wherein a difference between the thickness of the first confinement layer and the thickness of the first cladding layer is between 100 nm and 400 nm.

20. The light-emitting device according to claim 15, wherein the thickness of the first cladding layer is between 150 nm and 650 nm.

* * * * *